(12) United States Patent
Meguro et al.

(10) Patent No.: US 10,039,196 B2
(45) Date of Patent: Jul. 31, 2018

(54) PORTABLE DEVICE

(71) Applicant: CASIO COMPUTER CO., LTD., Tokyo (JP)

(72) Inventors: Hiromasu Meguro, Sagamihara (JP); Yasunori Chiba, Tachikawa (JP); Shinya Okumura, Higashiyamoto (JP)

(73) Assignee: CASIO COMPUTER CO., LTD., Tokyo (JP)

( * ) Notice: Subject to any disclaimer, the term of this patent is extended or adjusted under 35 U.S.C. 154(b) by 0 days.

(21) Appl. No.: 15/690,865

(22) Filed: Aug. 30, 2017

(65) Prior Publication Data

US 2018/0084654 A1 Mar. 22, 2018

(30) Foreign Application Priority Data

Sep. 16, 2016 (JP) ................................ 2016-181871

(51) Int. Cl.
*H05K 5/00* (2006.01)
*H05K 5/02* (2006.01)

(52) U.S. Cl.
CPC ......... *H05K 5/0008* (2013.01); *H05K 5/0086* (2013.01); *H05K 5/023* (2013.01); *H05K 5/0217* (2013.01)

(58) Field of Classification Search
CPC .... H05K 5/0008; H05K 5/023; H05K 5/0086; H05K 5/0217
USPC ......... 361/679.34, 752, 753, 210; 455/575.1, 455/90.3; 174/138 G
See application file for complete search history.

(56) References Cited

U.S. PATENT DOCUMENTS

| 5,550,712 | A | * | 8/1996 | Crockett | ................ H05K 7/142 174/564 |
| 6,144,552 | A | * | 11/2000 | Whitcher | .......... G02F 1/133308 248/917 |
| 6,344,972 | B2 | * | 2/2002 | Estieule | ................... H01R 4/64 361/753 |
| 6,347,044 | B1 | * | 2/2002 | Won | ..................... G06F 1/1616 174/138 G |

(Continued)

FOREIGN PATENT DOCUMENTS

| EP | 2 469 809 A1 | 6/2012 |
| JP | H07-273478 A | 10/1995 |

(Continued)

OTHER PUBLICATIONS

Extended European Search Report dated Feb. 12, 2018 received in EP Patent Application No. 17188276.4.

*Primary Examiner* — Dimary Lopez Cruz
*Assistant Examiner* — Abhishek Rathod
(74) *Attorney, Agent, or Firm* — Scully, Scott, Murphy & Presser, P.C.

(57) ABSTRACT

A portable device of the present invention includes an exterior member of which an inside is hollow, a plurality of support parts provided in the inside of the exterior member so as to stand up in a direction perpendicular to a front or back surface of the exterior member, a plurality of buffer members provided around each of the plurality of support parts, and an inner member kept in the inside of the exterior member in parallel with the front or back surface of the exterior member without being in contact with the exterior member by the plurality of buffer members.

11 Claims, 8 Drawing Sheets

(56) References Cited

U.S. PATENT DOCUMENTS

| | | | | |
|---|---|---|---|---|
| 6,483,719 B1* | 11/2002 | Bachman | ............... | H05K 9/003 174/378 |
| 6,493,233 B1* | 12/2002 | De Lorenzo | ........... | H05K 3/325 174/138 G |
| 8,116,101 B2* | 2/2012 | Chang | ................... | G06F 1/1656 174/371 |
| 8,493,722 B2* | 7/2013 | Chien | ................... | H05K 5/0204 248/571 |
| 8,644,028 B2* | 2/2014 | Qin | ....................... | H05K 7/142 361/758 |
| 2005/0225893 A1* | 10/2005 | Nakamura | ............. | G11B 33/08 360/97.13 |
| 2006/0058078 A1* | 3/2006 | Shiogama | ............ | H04M 1/0202 455/575.1 |
| 2008/0043430 A1* | 2/2008 | Chen | ........................ | G06F 1/20 361/679.34 |
| 2008/0182633 A1* | 7/2008 | Imaizumi | ............ | H04M 1/0249 455/575.1 |
| 2009/0168337 A1* | 7/2009 | Conti | .................... | G06F 1/1626 361/679.56 |
| 2010/0048147 A1* | 2/2010 | Kim | .................... | H04M 1/0249 455/90.3 |
| 2012/0160733 A1 | 6/2012 | Liang | | |
| 2012/0165081 A1 | 6/2012 | Ushigome et al. | | |
| 2012/0314354 A1 | 12/2012 | Rayner | | |
| 2013/0128417 A1 | 5/2013 | Wang et al. | | |
| 2015/0124386 A1* | 5/2015 | Kitaura | ............... | H04M 1/0237 361/679.3 |
| 2015/0268698 A1 | 9/2015 | Hofmann et al. | | |
| 2015/0271308 A1 | 9/2015 | Roessler et al. | | |
| 2016/0183394 A1* | 6/2016 | Raschilla | ............. | H05K 5/0217 361/752 |

FOREIGN PATENT DOCUMENTS

| | | |
|---|---|---|
| JP | H08-255987 A | 10/1996 |
| JP | H11-230263 A | 8/1999 |
| JP | 2012-134785 A | 7/2012 |

* cited by examiner

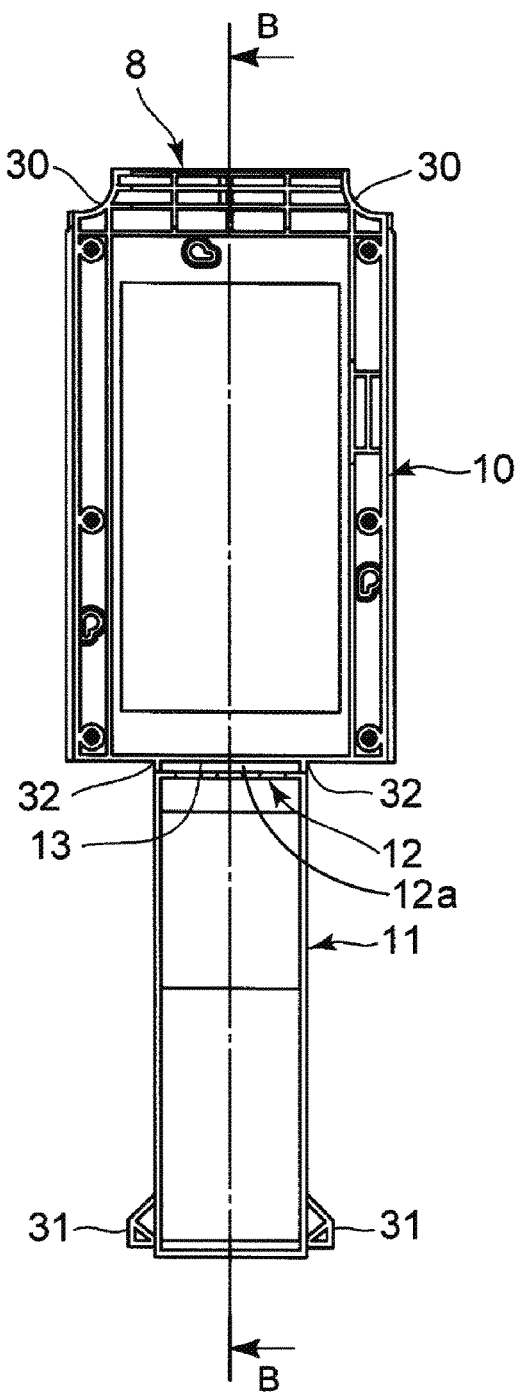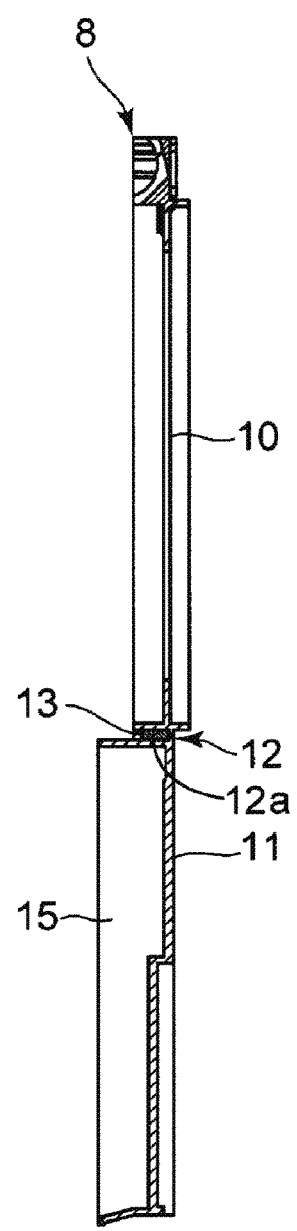

PORTABLE DEVICE

CROSS-REFERENCE TO RELATED APPLICATIONS

This application is based upon and claims the benefit of priority from the prior Japanese Patent Application No. 2016-181871, filed on Sep. 16, 2016, the entire contents of which are incorporated herein by reference.

BACKGROUND

1. Field of the Invention

The present invention relates to a portable device such as a portable terminal, a mobile phone and the like.

2. Description of the Related Art

For example, as shown in Patent Document 1, a device case (an exterior member) of the portable terminal is provided therein with an inner case (an inner member) and a variety of components are mounted to the inner case, so that the diverse components are incorporated into the device case (refer to Japanese Patent Application Publication No. 2012-134785A).

The above type of the portable terminal includes the device case having an upper case and a lower case, a first fitting part provided at a peripheral edge portion of the upper case, a second fitting part provided at a peripheral edge portion of an upper surface of the inner case and configured to be fitted to the first fitting part of the upper case, a third fitting part provided at a peripheral edge portion of a lower surface of the inner case and a fourth fitting part provided at a peripheral edge portion of the lower case and configured to be fitted to the third fitting part of the inner case.

The portable terminal has a configuration where the upper case and the lower case are coupled to each other by the inner case, so that stiffness of the device case is increased and when a shock is applied from an outside, the shock is integrally received by the upper case, the lower case and the inner case and deformation and positional deviation of the upper case, the lower case and the inner case are thus prevented.

SUMMARY

A portable device of the present invention includes an exterior member of which an inside is hollow, a plurality of support parts provided in the inside of the exterior member so as to stand up in a direction perpendicular to a front or back surface of the exterior member, a plurality of buffer members provided around each of the plurality of support parts, and an inner member kept in the inside of the exterior member in parallel with the front or back surface of the exterior member without being in contact with the exterior member by the plurality of buffer members.

BRIEF DESCRIPTION OF THE DRAWINGS

FIG. 6A is a front view of an inner case shown in FIG. 5.

FIG. 6B is a sectional view taken along a B-B arrow direction of the inner case shown in FIG. 6A.

DETAILED DESCRIPTION OF THE EMBODIMENTS

Hereinafter, an embodiment in which the present invention is applied to a portable terminal will be described with reference to FIGS. 1 to 8.

Figure 1:
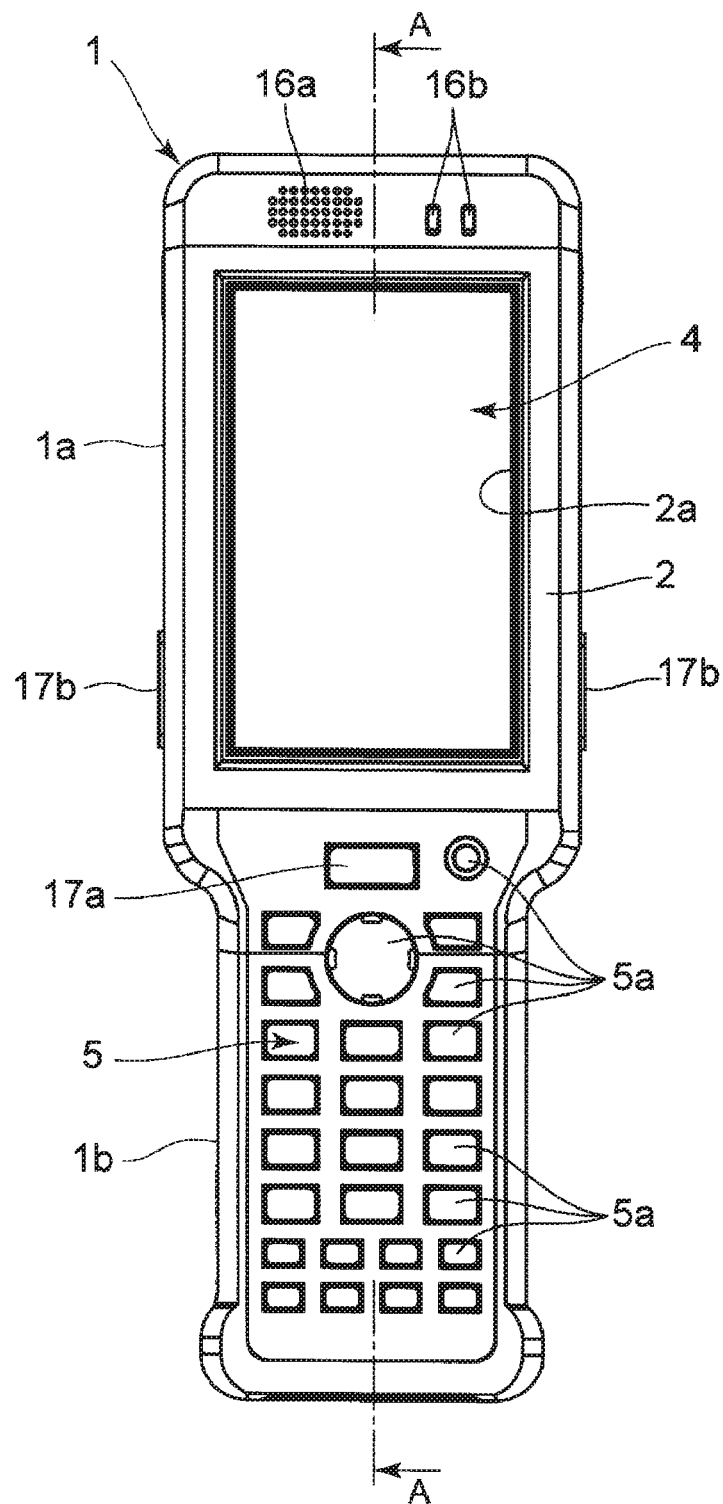
FIG. 1 is a front view depicting an embodiment in which the present invention is applied to a portable terminal.
Figure 2:
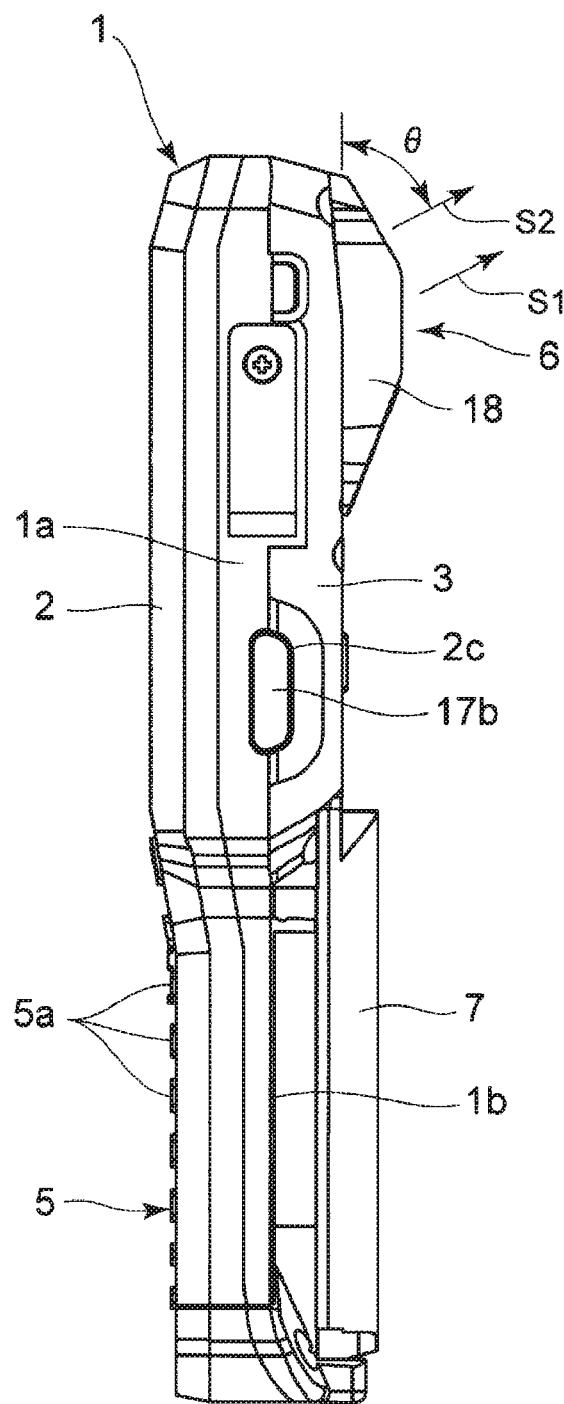
FIG. 2 is a side view of the portable terminal shown in FIG. 1.
Figure 3:
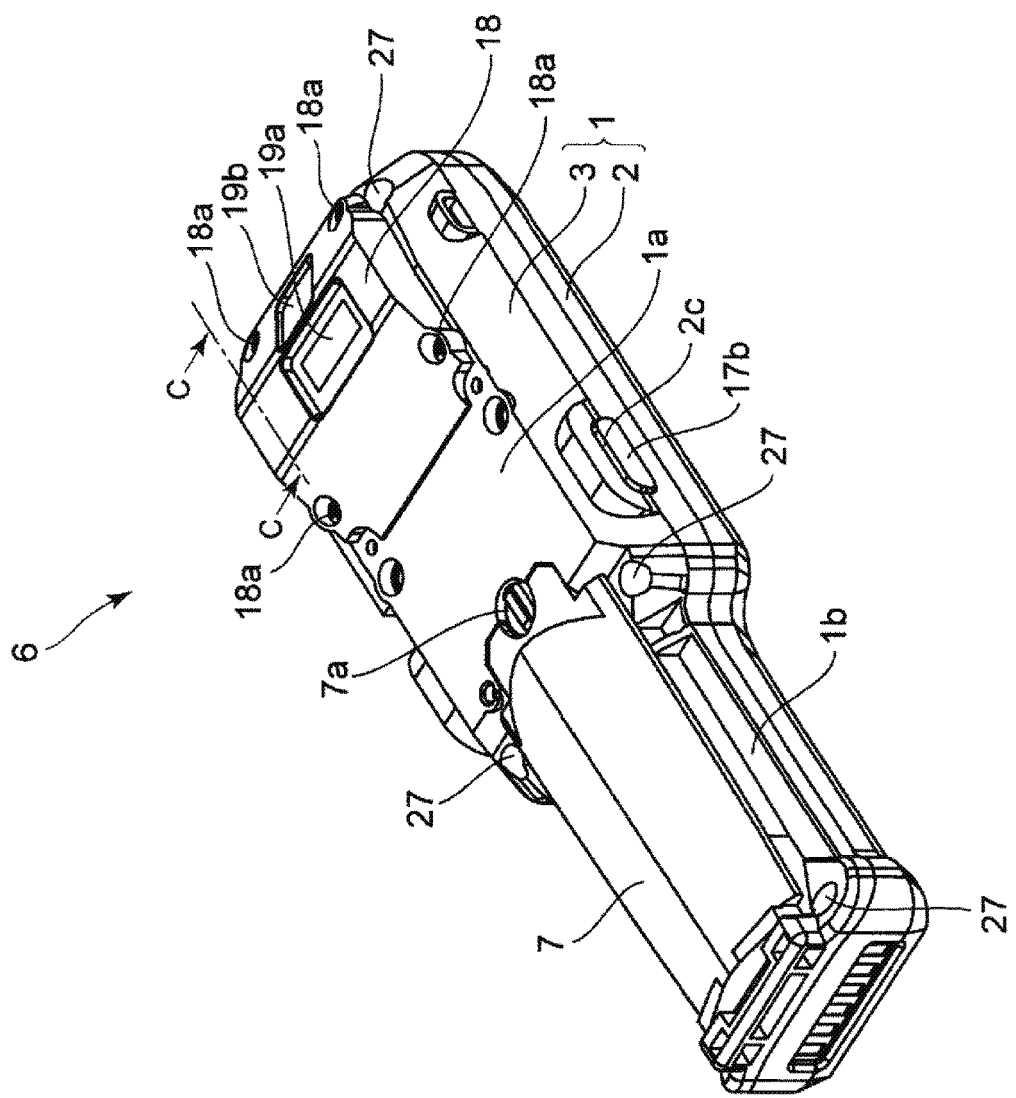
FIG. 3 is a perspective view of the portable terminal shown in FIG. 1, as seen from a back surface-side.

As shown in FIGS. 1 to 3, the portable terminal includes a device case 1, which is an exterior member. The device case 1 has an upper case 2 and a lower case 3. A display unit 4 and an input unit 5 are arranged in the upper case 2. A reading device 6 and a battery cover 7 are provided on a back surface (a front surface in FIG. 3) of the lower case 3.

In this case, as shown in FIGS. 1 to 3, the device case 1 has a configuration where a tip end portion-side (an upper part-side in FIG. 1) positioned at the display unit 4-side of the upper case 2 and the reading device 6-side of the lower case 3 corresponding to the display unit-side is formed as a rectangular main body part 1a, which is long in a front and rear direction (an upper and lower direction in FIG. 1), and a near side (a lower part-side in FIG. 1) positioned at the input unit 5-side of the upper case 2 and the battery cover 7-side of the lower case 3 corresponding to the input unit-side is formed as a rectangular gripping part 1b, which is long in the front and rear direction (the upper and lower direction in FIG. 1).

That is, as shown in FIGS. 1 to 3, the device case 1 has a configuration where a length (width) of the gripping part 1b in a direction perpendicular to a longitudinal direction of the device case 1 is shorter than a length (width) of the main body part 1a in the direction perpendicular to the longitudinal direction of the device case. Thereby, the device case 1 is entirely formed to have a substantial battledore shape. That is, the device case 1 is formed so that an area of a front surface of the main body part 1a is greater than an area of a front surface of the gripping part 1b and the gripping part 1b can be easily gripped.

As shown in FIGS. 4 to 6B, the device case 1 is provided therein with an inner case 8, which is an inner member. The inner case S has a first frame 10 arranged in the main body part 1a of the device case 1, a second frame 11 arranged in parallel with the first frame 10 in the gripping part 1b of the device case 1, a coupling part 12 configured to couple the first frame 10 and the second frame 11 and a first buffer member 13 provided at the coupling part 12.

Figure 5:
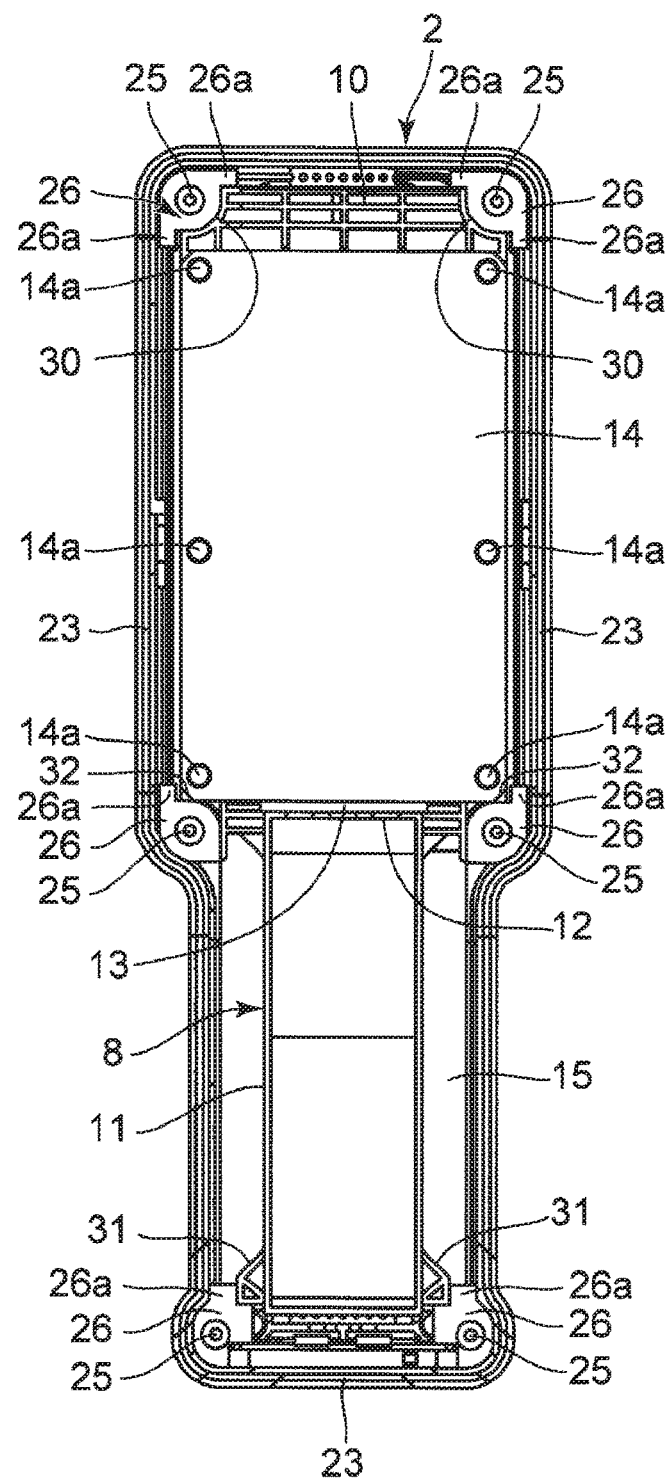
FIG. 5 is a rear view depicting a state where a lower case is detached from the portable terminal shown in FIG. 3.
Figure 7A:
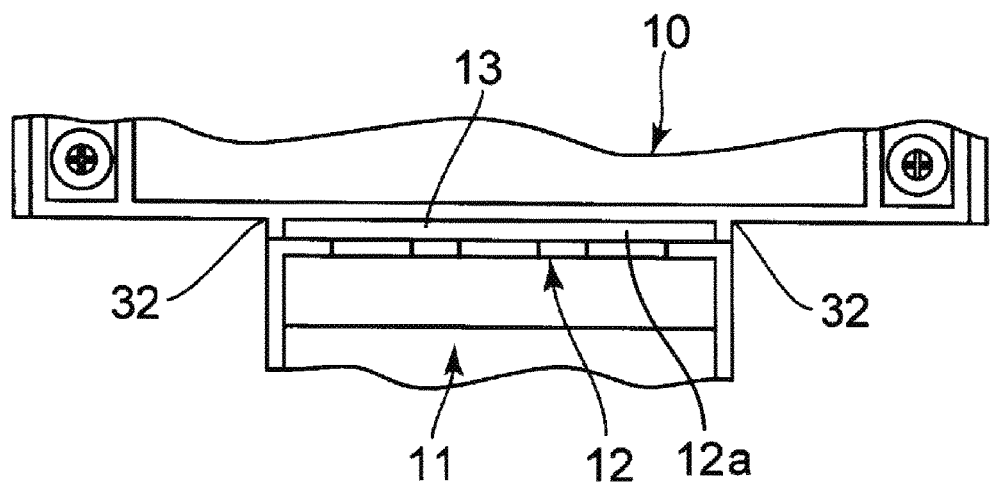
FIG. 7A is an enlarged front view depicting main parts of the inner case shown in FIG. 6A.
Figure 7B:
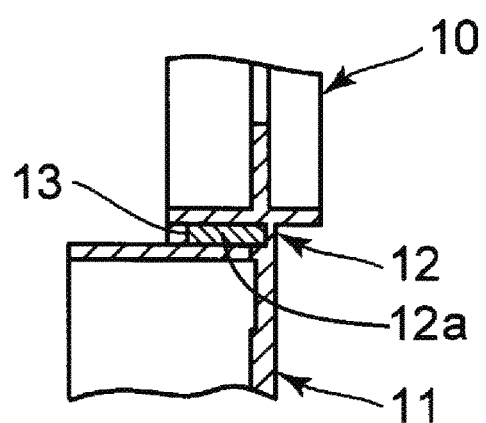
FIG. 7B is an enlarged sectional view depicting main parts of the inner case shown in FIG. 6B.

In this case, as shown in FIGS. 5 to 6B, the first frame 10 and the second frame 11 have a rectangular shape, respectively, and are integrally formed with the coupling part 12 by a synthetic resin such as an ABS resin, a composite material of PC (polycarbonate) resin and ABS (acrylonitrile butadiene styrene) resin, or the like. The first frame 10 has a frame shape, which is the same rectangular shape as the main body part 1a of the device case 1 and is slightly smaller than the main body part 1a.

As shown in FIGS. 5 to 6B, the second frame 11 has a bucket-like shape, which is the same rectangular shape as the gripping part 1b of the device case 1 and is slightly smaller than the gripping part 1b, i.e., a shape having a semicircular section or a trapezoidal section. A length of the second frame 11 in a direction perpendicular to a longitudinal direction of the inner case 8, which is a coupling direction in which the first frame 10 and the second frame 11 are coupled to each other, is shorter than a length of the first frame 10 in the direction perpendicular to the longitudinal direction that is the coupling direction.

As shown in FIGS. 5 to 7B, a length of the coupling part 12 in the direction perpendicular to the longitudinal direction of the inner case 8, which is the coupling direction in which the first frame 10 and the second frame 11 are coupled to each other, is substantially the same as the length of the second frame 11 in the direction perpendicular to the longitudinal direction that is the coupling direction. The coupling part 12 is formed with a slit-shaped fitting portion 12a, which is configured to fit therein the first buffer member 13 and has a length slightly smaller than the length of the second frame 11 in the direction perpendicular to the longitudinal direction.

In this case, as shown in FIGS. 6A to 7A, a length of the slit-shaped fitting portion 12a in the longitudinal direction of the inner case 8 is slightly smaller than a length of the coupling part 12 in the longitudinal direction of the inner case 8 and a length of the slit-shaped fitting portion 12a in the direction perpendicular to the longitudinal direction of the inner case 8 is slightly smaller than the length of the coupling part 12 in the direction perpendicular to the longitudinal direction of the inner case 8.

That is, as shown in FIGS. 6A to 7B, the fitting portion 12a is formed to be slightly smaller than an outward shape of the coupling part 12, except for a peripheral edge portion of the coupling part 12. Also, the fitting portion 12a has a concave shape that does not penetrate in a thickness direction, which is a front and back surface direction of the coupling part 12. However, the present invention is not limited thereto. For example, the fitting portion may also be formed to penetrate in the thickness direction, which is the front and back surface direction of the coupling part 12.

As shown in FIGS. 6A to 7B, the first buffer member 13 is formed of a synthetic resin having high resiliency and hardness of about 80 to 90 such as silicon resin, elastomer or the like. The hardness is measured by a type A durometer in accordance with HS (Japanese Industrial Standard) K 6253. The first buffer member 13 is formed to be slightly shorter than the length of the second frame 11 in the direction perpendicular to the longitudinal direction and is configured to be fitted into the slit-shaped fitting portion 12a of the coupling part 12.

That is, as shown in FIGS. 6A to 7B, the first buffer member 13 is fitted to elastically push and enlarge the fitting portion 12a with being fitted in the slit-shaped fitting portion 12a of the coupling part 12. Thereby, when the device case 1 is applied with shock from an outside and the shock is transmitted to the inner case 8, the first buffer member 13 buffers the shock to be concentrated on the coupling part 12, thereby protecting the coupling part 12.

Figure 4:
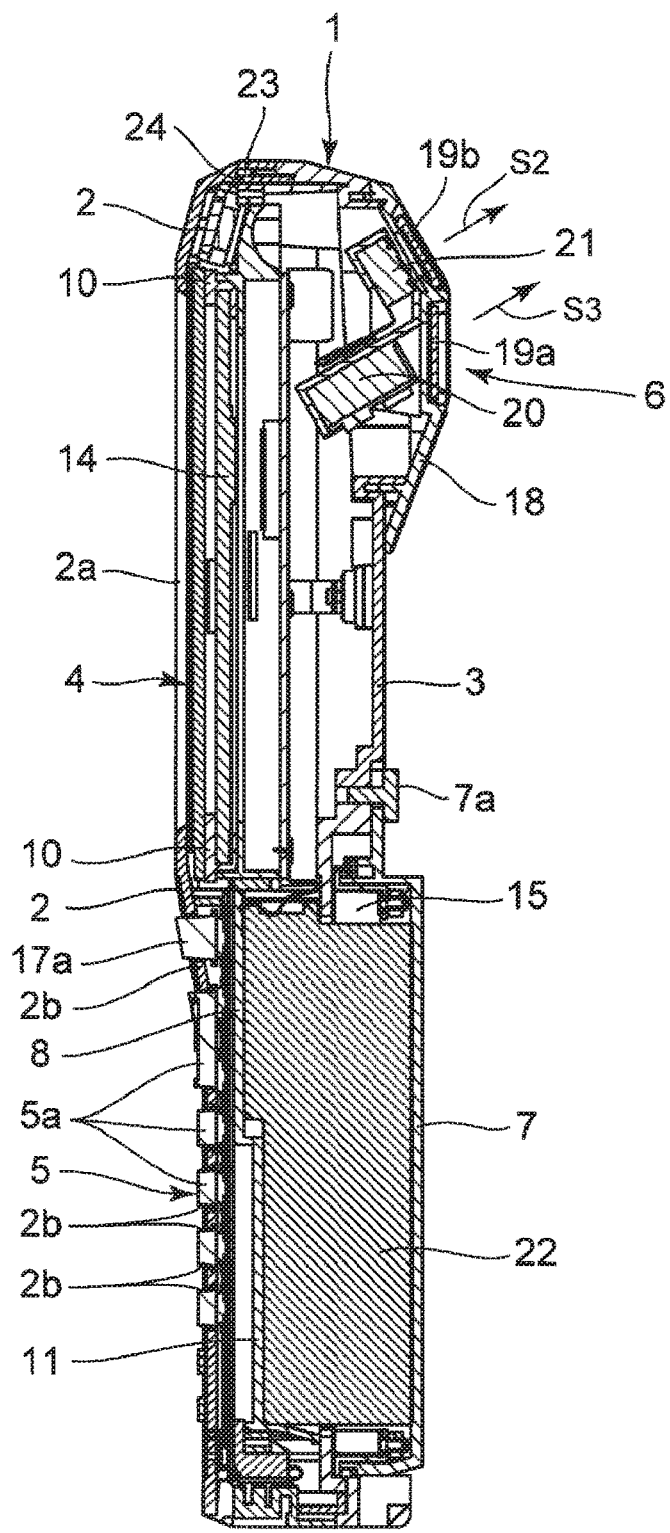
FIG. 4 is a sectional view taken along an A-A arrow direction of the portable terminal shown in FIG. 1.

In the meantime, as shown in FIG. 4, a front surface (a left surface in FIG. 4) of the first frame 10 is provided with the display unit 4. A back surface (a right surface in FIG. 4) of the first frame 10 is provided with a circuit board 14. Also, a front surface (a left surface in FIG. 4) of the second frame 11 is provided with the input unit 5. A back surface (a right surface in FIG. 4) of the second frame 11 is provided with a battery accommodation part 15.

As shown in FIGS. 1 and 4, the display unit 4 has a planar display panel such as a liquid crystal display panel, an EL (electro luminescence) display panel or the like. The display unit 4 is configured to electro-optically display information on the display panel. As shown in FIG. 4, the display unit 4 is arranged in the inside of the upper case 2, in correspondence to a display opening 2a formed at a part of the upper case 2 corresponding to the main body part 1a of the device case 1.

Thereby, as shown in FIGS. 1 and 4, the display unit 4 is configured so that the displayed information can be seen through the display opening 2a from the outside of the upper case 2. In this case, as shown in FIG. 1, a part of the upper case 2 positioned at the upper part-side of the display unit 4 is provided with a speaker 16a and a light emitting element (LED) 16b for indicator.

As shown in FIGS. 4 and 5, a circuit unit configured to control the entire portable terminal is mounted on the circuit board 14. The circuit board 14 is attached to the back surface (a front surface in FIG. 5) of the first frame 10 by a plurality of screws 14a. The circuit board 14 arranged in the inside of the upper case 2 at above-described state. The circuit board 14 is electrically connected to the display unit 4, the input unit 5, the reading device 6, the speaker 16a, the light emitting element 16b and a battery 22 (which will be described later) respectively.

As shown in FIGS. 1, 2 and 4, the input unit 5 includes diverse keys 5a such as a ten key, a calculation key, a cursor key, a decision key, a power supply key and the like. The input unit 5 is aligned on the upper case 2 with the diverse keys 5a being exposed outwards from a plurality of key insertion holes 2b formed in the front surface of the upper case 2. Thereby, the input unit 5 is configured to input the information by operating the diverse keys 5a.

In this case, as shown in FIGS. 1 and 2, an upper part of the input unit 5 is provided with a center trigger key 17a. The center trigger key 17a is inserted into the key insertion hole 2b formed at a substantially central portion of the upper case 2 and is exposed to a front surface-side. Also, as shown in FIGS. 2 and 3, both side surfaces of the device case 1 are provided with side trigger keys 17b, respectively. The side trigger keys 17b are inserted into key insertion holes 2c formed at both sides of the device case 1 and are exposed outwards.

As shown in FIGS. 2 to 4, the reading device 6 has a unit case 18. The unit case 18 is provided therein with a reading unit 20 and an imaging unit 21. In this case, the unit case 18 is configured to be detachably attached to a back surface (a front surface in FIG. 3) of the lower case 3 by a plurality of screws 18a.

As shown in FIG. 4, the reading unit 20 is a scanner. The reading unit 20 is configured to illuminate a light beam such as a laser light beam to an object to be read (not shown), to receive reflected light and to read code information of the object to be read. The imaging unit 21 is a camera having an imaging element. The imaging unit 21 is configured to capture the object to be read, which is to be read by the reading unit 20, as an image.

As shown in FIG. 4, the reading device 6 is configured in such a way that the code information of the object to be read, which is read by the reading unit 20, is displayed on the display unit 4 and the image of the object to be read captured by the imaging unit 21 is displayed on the display unit 4, so that it is possible to perform the reading operation by the reading unit 20 and the capturing operation by the imaging unit 21 at the same time while seeing the code information of the object to be read and the image of the object to be read displayed on the display unit 4.

As shown in FIGS. 3 and 4, the unit case 18 is formed by protruding a rectangular plate into a mountain shape gently inclined in the longitudinal direction of the device case 1. The unit case 18 is provided with a reading window part 19a corresponding to the reading unit 20 and an imaging window part 19b corresponding to the imaging unit 21. The reading unit 20 and the imaging unit 21 are set so that an illumination direction S1 of the light beam from the reading unit 20 and an imaging direction S2 of the imaging unit 21 are the same.

In this case, as shown in FIGS. 2 and 4, the reading unit 20 and the imaging unit 21 are arranged in the unit case 18 at a state where the illumination direction S1 of the light beam from the reading unit 20 and the imaging direction S2 of the imaging unit 21 are inclined relative to the back surface of the device case 1 by a predetermined angle θ. That is, the illumination direction S1 of the light beam from the reading unit 20 and the imaging direction S2 of the imaging unit 21 are preferably inclined relative to the back surface of the lower case 3 within an angle range of 40° to 80°, preferably at an angle of 60° towards a tip end-side of the lower case 3 positioned at an opposite side to the gripping part 1b.

As shown in FIGS. 4 and 5, the second frame 11 is formed with the battery accommodation part 15 having a shape of a semicircular section or a trapezoidal section convex towards a front surface thereof (a left surface in FIG. 4). The back surface (a right surface in FIG. 4) of the accommodation part 15 is opened and the battery 22 is accommodated through the opened part. The battery accommodation part 15 is arranged in the lower case 3 together with the second frame 11, and is blocked by the battery cover 7 at that state.

As shown in FIGS. 3 and 4, the battery cover 7 is configured to be detachably attached to the back surface-side (a front surface-side in FIG. 3) of the lower case 3 corresponding to the back surface-side of the input unit 5 by a screw 7a. That is, the battery cover 7 is formed to have a reverse bucket-like shape having a semicircular section and is configured to cover and block the battery accommodation part 15 in the lower case 3 with a back surface-side being convex so as to easily grip the gripping part 1b.

Figure 8:
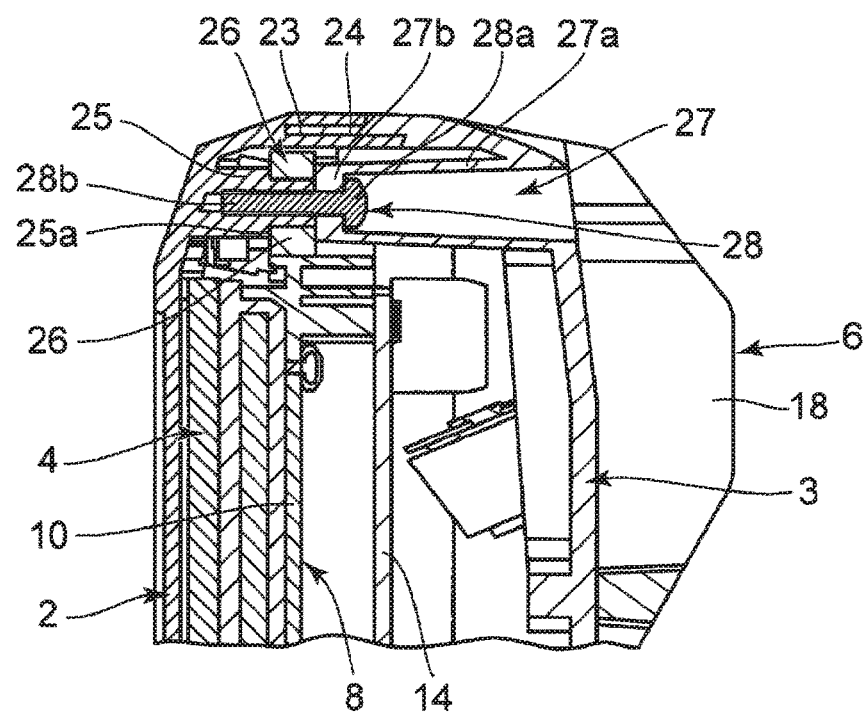
FIG. 8 is an enlarged sectional view of main parts taken along a C-C arrow direction of the portable terminal shown in FIG. 3.

As shown in FIG. 8, the device case 1 is configured so that when the upper case 2 and the lower case 3 are superimposed, an engaging protrusion 24 provided at an upper peripheral edge portion (a left peripheral edge portion in FIG. 8) of the lower case 3 is engaged with an engaging groove 23 provided at a lower peripheral edge portion (a right peripheral edge portion in FIG. 8) of the upper case 2 and the upper case 2 and the lower case 3 are thus coupled.

That is, as shown in FIGS. 5 and 8, the engaging groove 23 of the upper case 2 is formed along an outer periphery of an inner lower part (a front surface part in FIG. 5) of the upper case 2. As shown in FIG. 8, the engaging protrusion 24 of the lower case 3 is formed along an outer periphery of an inner upper part of the lower case 3. Thereby, the device case 1 is configured so that when the upper case 2 and the lower case 3 are superimposed, the engaging protrusion 24 of the lower case 3 is fitted into the engaging groove 23 of the upper case 2 and the upper case 2 and the lower case 3 are thus coupled.

Also, as shown in FIGS. 5 and 8, the device case 1 has a plurality of support boss parts 25 provided in the inside of the upper case 2 of the upper case 2 and the lower case 3 so as to stand up in a direction perpendicular to a front surface of the upper case and configured to couple the upper case 2 and the lower case 3 and a plurality of second buffer members 26 provided around the plurality of support boss parts 25 and configured to elastically contact the upper case 2 and the lower case 3.

In this case, as shown in FIGS. 5 and 8, each of the plurality of support boss parts 25 is formed to have a cylindrical shape having a screw portion formed therein and is configured to stand up on an inner surface positioned at the front surface-side of the upper case 2. That is, as shown in FIG. 8, each of the plurality of support boss parts 25 is formed so that an outer diameter of a base end portion positioned at the front surface-side of the upper case 2 is larger than an outward shape of a tip end portion positioned at the lower case 3-side.

Thereby, as shown in FIG. 8, each of the plurality of support boss parts 25 has a cylindrical shape where a step-shaped receiving portion 25a is formed on an outer peripheral surface. Also, the plurality of support boss parts 25 is respectively configured so that the plurality of screws 28 is respectively to be screwed through a plurality of screw insertion portions 27 provided at the lower case 3.

In this case, as shown in FIG. 8, each of the plurality of screw insertion portions 27 is formed to hang from an inner surface of the back surface-side (a right inner surface in FIG. 8) of the lower case 3 towards the back surface-side (a right side in FIG. 8) of the upper case 2. Each of the plurality of screw insertion portions 27 has a cylindrical portion 27a in which the screw 28 is to be inserted together with the head portion 28a and a contact portion 27b provided at an upper end portion (a left end portion in FIG. 8) of the cylindrical portion 27a and having an insertion hole in which the screw portion 28b of the screw 28 is to be inserted.

Thereby, as shown in FIG. 8, the plurality of support boss parts 25 is configured so that when the respective screw portions 28b of the plurality of screws 28 are screwed through the plurality of screw insertion portions 27 of the lower case 3, the upper case 2 and the lower case 3 are fixed to each other at a state where the upper case 2 and the lower case 3 elastically sandwich the plurality of second buffer members 26.

That is, as shown in FIG. 8, the upper case 2 and the lower case 3 are configured in such a way that when the respective screw portions 28b of the plurality of screws 28 are screwed into the plurality of support boss parts 25, the respective head portions 28a of the plurality of screws 28 press the respective contact portions 27b of the plurality of screw insertion portions 27 to the plurality of second buffer members 26 and the plurality of second buffer members 26 is pressed to the respective step-shaped receiving portions 25a of the plurality of support boss parts 25, so that the plurality of second buffer member 26 are elastically sandwiched.

In this case, as shown in FIG. 5, the plurality of support boss parts 25 is provided not only at four corners in the upper case 2 but also at both sides positioned at an intermediate part of the upper case 2 in the longitudinal direction. Also, as shown in FIG. 8, the plurality of screw insertion portions 27 is provided at four corners of the lower case 3 and at both sides positioned at an intermediate part of the lower case 3 in the longitudinal direction, in correspondence to the plurality of support boss parts 25.

As shown in FIGS. 5 and 8, the plurality of second buffer members 26 is arranged at outer peripheries of the small-diameter tip end portions of the plurality of support boss parts 25 and has a substantially cylindrical shape configured to elastically contact the inner peripheral surface of the upper case 2. Each of the second buffer members 26 is configured so that an end face positioned at the front surface-side thereof is to elastically contact the step-shaped receiving portion 25a of each of the plurality of support boss parts 25 provided at the upper case 2, an end face positioned at the back surface-side is to elastically contact the contact portion 27b provided at a lower end portion of the screw insertion portion 27 of the lower case 3 and an outer peripheral surface is to elastically contact the inner peripheral surface of the upper case 2.

That is, like the first buffer member 13, the plurality of second buffer members 26 is formed to have a substantially cylindrical shape by a synthetic resin having high resiliency and hardness of about 80 to 90 such as silicon resin, elastomer or the like. The hardness is measured by a type A durometer in accordance with JIS (Japanese Industrial Standard) K 6253. As shown in FIG. 5, each of the plurality of second buffer members 26 is formed so that an outer peripheral surface thereof conforms to the inner peripheral surface of the upper case 2, i.e., an inner surface corresponding to a side surface perpendicular to the front surface of the upper case 2, and is formed to elastically contact the inner peripheral surface of the upper case 2.

In this case, as shown in FIG. 5, each of the plurality of second buffer members 26 is formed with a protrusion 26a extending in a direction following the inner peripheral surface of the upper case 2, i.e., the inner surface corresponding to the side surface perpendicular to the front surface of the upper case 2. Each protrusion 26a of each of the plurality of second buffer members 26 is formed to be in additionally elastic contact the inner peripheral surface of the upper case 2, together with the outer peripheral surface of the second buffer member 26.

Also, as shown in FIGS. 5 and 8, the plurality of second buffer members 26 is configured to hold the inner case 8 arranged between the upper case 2 and the lower case 3 without being in contact with the device case 1. In this case, the inner case 8 is provided with first to third mounting portions 30 to 32 to which the plurality of second buffer members 26 is respectively to be mounted.

That is, as shown in FIGS. 5 and 6A, the first mounting portions 30 are provided at both sides of the upper side of the inner case 8. i.e., both sides of the upper side of the first frame 10. The second mounting portions 31 are provided at both sides of the lower side of the inner case 8, i.e., both sides of the lower side of the second frame 11 so as to protrude towards the respective support boss parts 25. The third mounting portions 32 are provided at both sides of the intermediate part of the inner case 8 in the longitudinal direction, i.e., at portions positioned at both sides of the coupling part 12 and the outer periphery of the battery accommodation part 15.

In this case, as shown in FIG. 5, the first mounting portions 30 provided at both sides of the upper side of the first frame 10 are formed into circular arc-shaped notched portions to which the second buffer members 26 corresponding to the first mounting portions are to be mounted. The second mounting portions 31 provided at both sides of the lower side of the second frame 11 are formed into projections that are to be bitten to the second buffer members 26 corresponding to the second mounting portions. The third mounting portions 32 provided at the portions positioned at both sides of the coupling part 12 and the outer periphery of the battery accommodation part 15 are formed into notched step portions to which the second buffer members 26 corresponding to the third mounting portions are to be mounted.

Thereby, as shown in FIGS. 5 and 8, the inner case 8 is configured in such a way that the first to third mounting portions 30 to 32 are mounted to the respective outer peripheries of the plurality of second buffer members 26, so that the inner case is held in the device case 1 by the plurality of second buffer members 26 without being in contact with the inner case 1.

In this case, as shown in FIGS. 5 and 8, the inner case 8 is configured so that when the device case 1 is applied with shock such as dropping and the shock is transmitted to the inner case 8 at the state where the first to third mounting portions 30 to 32 are mounted to the plurality of second buffer member 26 and are held in the device case 1, the shock in the longitudinal direction of the inner case 8, the shock in the direction perpendicular to the longitudinal direction and the shock in the thickness direction, which is a front and back surface direction, are buffered by the plurality of second buffer members 26 and thus the shock is not transmitted to the inner case 8.

Subsequently, operations of the portable terminal configured as described above are described.

When assembling the portable terminal, the inner case 8 is formed in advance and the display unit 4, the input unit 5 and the circuit board 14 are mounted to the inner case 8. That is, when forming the inner case 8, the first frame 10 and the second frame 11 and the coupling part 12 are integrally formed by a synthetic resin such as an ABS resin, a composite material of PC resin and ABS resin, or the like.

At this time, the first buffer member 13 made of a synthetic resin having resiliency such silicon resin, elastomer or the like may be integrally embedded in the coupling part 12 by two-color molding. However, it is preferably to form the coupling part 12 with the slit-shaped fitting portion 12a and to fit the first buffer member 13 in the fitting portion 12a. In this case, the first buffer member 13 is fitted in the fitting portion 12a with pushing and enlarging the fitting portion 12a in the longitudinal direction of the inner case 8.

At this state, the display unit 4 is attached to the front surface of the first frame 10 and the circuit board 14 is attached to the back surface of the first frame 10. Also, the input unit 5 is attached to the front surface of the second frame 11. Then, the inner case 8 having the display unit 4, the circuit board 14 and the input unit 5 mounted thereto is incorporated into the upper case 2 of the device case 1.

In this case, the plurality of second buffer members 26 is respectively arranged at the respective outer peripheries of the small-diameter tip end portions of the plurality of support boss parts 25 provided in the upper case 2, in advance. At this time, the respective end faces of the front surface-side of the plurality of second buffer members 26 are elastically contacted to the step-shaped receiving portions 25a of the plurality of support boss parts 25 provided at the upper case 2 and the respective outer peripheral surfaces of the plurality of second buffer members 26 are elastically contacted to the inner peripheral surface of the upper case 2, i.e., the inner surface corresponding to the side surface perpendicular to the front surface of the upper case 2.

At this state, the inner case 8 is arranged in the upper case 2. At this time, the first to third mounting portions 30 to 32 of the inner case 8 are mounted to the respective outer peripheries of the plurality of second buffer members 26. That is, the first mounting portions 30 formed into the circular arc-shaped notch portion shape at both sides of the upper side of the first frame 10 are mounted to the second buffer members 26 corresponding to the first mounting portions, so that the first mounting portions 30 are elastically contacted and held to the outer peripheries of the second buffer members 26.

Likewise, the second mounting portions 31 formed into the projection shape at both sides of the lower side of the second frame 11 are bitten to the second buffer members 26 corresponding to the second mounting portions, so that the second mounting portions 31 are elastically held to the outer peripheries of the second buffer members 26. Also, the third mounting portions 32 formed into notched step portions at the portions positioned at both sides of the coupling part 12 and both sides of the battery accommodation part 15 are mounted to the second buffer members 26 corresponding to the third mounting portions, so that the third mounting portions 32 are elastically contacted and held to the outer peripheries of the second buffer member 26.

Thereby, the first to third mounting portions 30 to 32 are mounted to the respective outer peripheries of the plurality of second buffer members 26, so that the inner case 8 is kept in the upper case 2 by the plurality of second buffer members 26 without being in contact with the upper case 2. For this reason, the inner case 8 is kept in the upper case 2 at a state where the shock to be applied from the longitudinal direction of the inner case 8, the shock to be applied from the direction perpendicular to the longitudinal direction and the shock to be applied from the thickness direction, which is a front and back surface direction, are buffered by the plurality of second buffer members 26.

At this state, the display unit 4 is arranged in correspondence to the display opening 2a of the upper case 2, and the respective keys 5a of the input unit 5 are exposed outwards with being inserted into the key insertion holes 2b of the upper case 2. Also, at this time, the center trigger key 17a is exposed outwards with being inserted into the key insertion hole 2b of the upper case 2 and the side trigger keys 17b are exposed outwards with being inserted into the key insertion holes 2c of both sides of the upper case 2 positioned at both sides of the device case 1.

Then, the lower case 3 is attached to the upper case 2. At this time, the engaging protrusion 24 provided at the peripheral edge portion of the front surface-side of the lower case 3 is arranged to face the engaging groove 23 provided at the peripheral edge portion of the back surface-side of the upper case 2, the plurality of screw insertion portions 27 provided at the lower case 3 is arranged to face the plurality of support boss parts 25 provided at the upper case 2, and the upper case 2 and the lower case 3 are then superimposed at that state.

Thereby, the engaging protrusion 24 of the lower case 3 is fitted in the engaging groove 23 of the upper case 2, so that the upper case 2 and the lower case 3 are coupled to each other. At this state, the plurality of screws 28 is respectively inserted into the respective cylindrical portions 27a of the plurality of screw insertion portions 27 of the lower case 3, the respective screw portions 28b of the plurality of inserted screws 28 are inserted into the insertion holes of the respective contact portions 27b of the plurality of screw insertion portions 27 and the respective screw portions 28b of the plurality of inserted screws 28 are screwed and fastened to the plurality of support boss parts 25.

Thereby, the respective contact portions 27b of the plurality of screw insertion portions 27 of the lower case 3 are pressed and elastically contacted to the respective end faces of the back surface-side of the plurality of second buffer members 26 by the respective head portions 28a of the plurality of screws 28. In connection with this, the respective end faces of the front surface-side of the plurality of second buffer members 26 are pressed and elastically contacted to the respective step-shaped receiving portions 25a of the plurality of support boss parts 25 provided at the upper case 2. For this reason, the upper case 2 and the lower case 3 are fixed to each other via the plurality of second buffer members 26. As a result, the device case 1 is assembled.

At this state, the unit case 18 of the reading device 6 is attached to the back surface of the main body part 1a of the device case 1, i.e., the back surface of the lower case 3 corresponding to the main body part 1a of the device case 1 by the plurality of screws 18a. In this case, the reading unit 20 is arranged to face the reading window part 19a of the unit case 18 and the imaging unit 21 is arranged to face the imaging window part 19b of the unit case 18, and the reading unit 20 and the imaging unit 21 are mounted into the unit case 18 at that state, in advance.

Also, the battery 22 is accommodated in the battery accommodation part 15 provided at the second frame 11 of the inner case 8 corresponding to the gripping part 1b of the device case 1, and the battery accommodation part 15 provided in the gripping part 1b of the device case 1 is covered by the battery cover 7. At this state, the battery cover 7 is attached to the back surface of the lower case 3 corresponding to the gripping part 1b of the device case 1 by the screw 7a. Thereby, the portable terminal is assembled.

Subsequently, a using aspect of the portable terminal is described.

In this case, first, an operator grips the gripping part 1b of the device case 1 with a hand with the upper case 2 of the device case 1 facing upwards. At this state, since the display unit 4 and the input unit 5 of the upper case 2 face upwards, the operator can input information of goods, stocks thereof and the like by operating the diverse keys 5a of the input unit 5, and the input information is displayed on the display unit 4.

Also, when reading the code information and the image of the object to be read such as a label attached to the commercial goods by the reading device 6, the operator sets the reading window part 19a and the imaging window part 19b of the unit case 18 to face towards the object to be read and operates any one of the center trigger key 5b provided at the upper side part of the input unit 5 and the side trigger keys 5c provided at both sides of the device case 1. Thereby, the reading unit 20 of the reading device 6 reads the code information of the object to be read and the imaging unit 21 captures the object to be read, as an image, at the same time.

In this way, the code information and the image of the object to be read, which have been read by the reading device 6, are displayed on the display unit 4. For this reason, the operator operates the decision key 5a of the input unit 5 while seeing the code information and the image of the object to be read displayed on the display unit 4, so that the code information and the image of the object to be read displayed on the display unit 4 are stored.

In the meantime, when the device case 1 of the portable terminal is applied with the shock due to the dropping, for example, since the upper case 2 and the lower case 3 of the device case 1 are fixed to each other via the plurality of second buffer members 26, the shock applied to the device case 1 is buffered by the plurality of second buffer members 26.

That is, the plurality of second buffer members 26 is provided at the outer peripheries of the plurality of support boss parts 25 provided at the four corners in the upper case 2 and at both sides of the intermediate part of the upper case 2 in the longitudinal direction, the respective end faces of the front surface-side of the plurality of second buffer members 26 are in elastic contact with the respective step-shaped receiving portions 25a of the plurality of support boss parts 25 provided at the upper case 2, and the respective end faces of the back surface-side of the plurality of second buffer members 26 are in elastic contact with the respective contact portions 27b of the plurality of screw insertion portions 27 of the lower case 3. Therefore, when the device case 1 is applied with the shock in the thickness direction, it is possible to securely and favorably buffer the shock in the thickness direction by the plurality of second buffer members 26.

Also, the respective outer peripheries of the plurality of second buffer member 26 are in elastic contact with the inner peripheral surface of the upper case 2, i.e., the inner surface corresponding to the side surface perpendicular to the front surface of the upper case 2 at the state where the plurality of second buffer members 26 is provided at the outer peripheries of the plurality of support boss parts 25. Therefore, when the device case 1 is applied with the shock in the longitudinal direction or in the direction perpendicular to the longitudinal direction, it is possible to securely and favorably buffer the shock by the plurality of second buffer members 26. Thereby, it is possible to prevent the shock from being transmitted to the inner case 8 in the device case 1.

That is, since the plurality of second buffer members 26 is formed to have a substantially cylindrical shape conforming to the inner peripheral surface of the upper case 2, i.e., the inner surface corresponding to the side surface perpendicular to the front surface of the upper case 2 by the synthetic resin having high resiliency and hardness of about 80 to 90 such as silicon resin, elastomer or the like, it is possible to securely and favorably bring the outer peripheries thereof into elastic contact with the inner peripheral surface of the upper case 2.

In this case, the plurality of second buffer members 26 is formed with the protrusions 26a protruding in the direction following the inner peripheral surface of the upper case 2, i.e., the inner surface corresponding to the side surface perpendicular to the front surface of the upper case 2 so as to be in additionally elastic contact with the inner peripheral surface of the upper case 2. Thereby, when the device case 1 is applied with the shock from the outside, it is possible to further securely and favorably buffer the shock by the respective protrusions 26a of the plurality of second buffer members 26.

Also, the inner case 8 arranged in the device case 1 is kept in the device case 1 by the plurality of second buffer members 26 without being in contact with the device case 1. Therefore, even when the device case 1 is applied with the shock from the outside, the shock is buffered by the plurality of second buffer members 26, so that it is possible to prevent the shock applied to the device case 1 from being transmitted to the inner case 8. Thereby, it is possible to securely and favorably protect the components mounted on the inner case 8 such as the display unit 4, the input unit 5, the circuit board 14 and the like so that the components are not to be influenced by the shock.

That is, the inner case 8 has the first to third mounting portions 30 to 32 and the first to third mounting portions 30 to 32 are mounted to the respective outer peripheries of the plurality of second buffer members 26, so that it is possible to arrange the inner case 8 not to be in contact with the upper case 2 and the lower case 3 by the plurality of second buffer members 26. Thereby, even when the device case 1 is applied with the shock from the outside, it is possible to prevent the shock from being transmitted to the inner case 8.

In this case, the first mounting portions 30 formed into the circular arc-shaped notch portion shape at both sides of the upper side of the first frame 10 are mounted to the outer peripheries of the second buffer members 26 corresponding to the first mounting portions. The second mounting portions 31 formed into the projection shape at both sides of the lower side of the second frame 11 are bitten to the second buffer members 26 corresponding to the second mounting portions. The third mounting portions 32 formed into the notched step portions at the portions positioned at both sides of the coupling part 12 and the outer periphery of the battery accommodation part 15 are mounted to the outer peripheries of the second buffer members 26 corresponding to the third mounting portions. Therefore, it is possible to securely and favorably hold the inner case 8 in the device case 1 without being in contact with the device case 1.

That is, when the inner case 8 is held in the device case 1 with the first to third mounting portions 30 to 32 being mounted to the plurality of second buffer members 26, it is possible to securely and favorably buffer the shock to be applied from the longitudinal direction of the inner case 8, the shock to be applied from the direction perpendicular to the longitudinal direction and the shock to be applied from the thickness direction, which is a front and back surface direction of the inner case 8, by the plurality of second buffer members 26. For this reason, even when the device case 1 is applied with the shock from the outside, the shock is not transmitted to the inner case 8.

In the meantime, when the device case 1 is applied with the shock from the outside and the shock cannot be completely buffered by the plurality of second buffer members 26, the shock is transmitted to the inner case 8 in the device case 1. However, the shock transmitted to the inner case 8 is buffered by the first buffer member 13, so that it is possible to prevent the inner case 8 from being damaged due to the shock.

In this case, the first buffer member 13 is fitted to elastically push and enlarge the fitting portion 12a with being fitted in the slit-shaped fitting portion 12a of the coupling part 12 of the inner case 8 configured to couple the first frame 10 and the second frame 11. Thereby, it is possible to securely and favorably buffer the shock applied to the inner case 8 by the first buffer member 13.

That is, even when the device case 1 is applied with the shock from the outside and the shock is transmitted to the inner case 8 and is concentrated on the coupling part 12, the inner case 8 can securely and favorably buffer the shock concentrated on the coupling part 12 by the first buffer member 13. Therefore, it is possible to suppress the deterioration of the coupling part 12 due to the shock and to prevent the coupling part 12 from being damaged, thereby favorably protecting the coupling part 12.

In this case, since the heavy battery 22 is accommodated in the gripping part 1b of the device case 1, when the device case 1 is applied with the shock from the outside, the battery 22 generates the inertia force by the own weight and the shock resulting from the inertia force of the battery 22 is applied to the inner case 8. However, it is possible to securely and favorably buffer the shock due to the inertia force of the battery 22 by the first buffer member 13. For this reason, it is possible to suppress the deterioration of the coupling part 12 due to the shock of the inertia force of the battery 22, thereby preventing the coupling part 12 from being damaged.

Like this, the portable terminal includes the device case 1, which is an exterior member of which an inside is hollow, the plurality of support boss parts 25 provided in the inside of the device case 1 so as to stand up in the direction (i.e., the normal direction) perpendicular to the front and back surfaces of the device case 1, the plurality of second buffer members 26 provided around each of the plurality of support parts 25, and the inner case 8, which is an inner member kept in the inside of the device case 1 in parallel with the front and back surfaces of the device case 1 without being in contact with the device case 1 by the plurality of second buffer members 26. Thereby, it is possible to improve the shock resistance.

That is, according to the portable terminal, since the inner case 8 is kept in the inside of the device case 1 by the plurality of second buffer members 26 without being in contact with the device case 1, when the device case 1 is applied with the shock from the outside, it is possible to buffer the shock from the outside by the plurality of second buffer members 26 so that the shock is not transmitted to the inner case 8. Thereby, it is possible to improve the shock resistance. For this reason, according to the portable terminal, it is possible to favorably protect the components such as the display unit 4, the input unit 5, the circuit board 14 and the like mounted on the inner case 8 so that the components are not to be damaged due to the shock.

In this case, according to the portable terminal, the plurality of support boss parts 25 and the plurality of second buffer members 26 are provided at least at the four corners in the inside of the device case 1, so that it is possible to securely and favorably hold the four corners of the inner case 8 by the plurality of second buffer members 26. Thereby, it is possible to stably and favorably arrange the inner case 8 in the device case 1 and to securely and favorably buffer the shock from the outside by the plurality of second buffer members 26 provided at the four corners of the device case 1.

Also, according to the portable terminal, the plurality of support boss parts 25 and the plurality of second buffer members 26 are provided at both sides of the intermediate part in the longitudinal direction in the inside of the device case 1, too, so that it is possible to hold both sides of the intermediate part of the inner case 8 in the longitudinal direction by the plurality of support boss parts 25 and the plurality of second buffer members 26. For this reason, it is possible to further hold the inner case 8 in the device case 1 securely and favorably and to securely and favorably buffer the shock from the outside by the plurality of second buffer members 26 provided at both sides of the intermediate part in the longitudinal direction in the inside of the device case 1.

That is, according to the portable terminal, the inner case 8 has the first to third mounting portions 30 to 32 and the first to third mounting portions 30 to 32 are mounted to the respective outer peripheries of the plurality of second buffer members 26, so that it is possible to arrange the inner case 8 not to be in contact with the device case 1 by the plurality of second buffer members 26. Thereby, even when the device case 1 is applied with the shock from the outside, it is possible to prevent the shock from being transmitted to the inner case 8.

In this case, since the first mounting portions 30 formed into the circular arc-shaped notch portion shape at both sides of the upper side of the first frame 10 are mounted to the outer peripheries of the second buffer members 26 corresponding to the first mounting portions, the second mounting portions 31 formed into the projection shape at both sides of the lower side of the second frame 11 are bitten to the second buffer members 26 corresponding to the second mounting portions, and the third mounting portions 32 formed into the notched step portions at the portions positioned at both sides of the coupling part 12 and the outer periphery of the battery accommodation part 15 are mounted to the outer peripheries of the second buffer members 26 corresponding to the third mounting portions, it is possible to securely and favorably hold the inner case 8 not to be in contact with the device case 1.

That is, when the inner case 8 is held in the device case 1 with the first to third mounting portions 30 to 32 being mounted to the plurality of second buffer members 26, it is possible to securely and favorably buffer the shock to be applied from the longitudinal direction of the device case 1, the shock to be applied from the direction perpendicular to the longitudinal direction and the shock to be applied from the thickness direction, which is a front and back surface direction of the device case 1, by the plurality of second buffer members 26. For this reason, even when the device case 1 is applied with the shock from the outside, the shock is not transmitted to the inner case 8.

Also, according to the portable terminal, the respective outer peripheral surfaces of the plurality of second buffer members 26 are formed to have the shape conforming to the inner peripheral surface of the device case 1, i.e., the inner surface corresponding to the side surface perpendicular to the front and back surfaces of the device case 1 and are in elastic contact with the inner peripheral surface of the device case 1. Thereby, when the device case 1 is applied with the shock from the longitudinal direction of the device case 1 and the shock from the direction perpendicular to the longitudinal direction, it is possible to securely and favorably buffer the shocks by the plurality of second buffer members 26 and to prevent the shocks from being transmitted to the inner case 8.

In this case, the plurality of second buffer members 26 is formed with the protrusions 26a protruding in the direction following the inner peripheral surface of the upper case 2, i.e., the inner surface corresponding to the side surface perpendicular to the front surface of the upper case 2 so as to be in additionally elastic contact with the inner peripheral surface of the device case 1. Thereby, when the device case 1 is applied with the shock from the outside, it is possible to buffer the shock by the respective protrusions 26a of the plurality of second buffer members 26, too. Therefore, it is possible to further buffer the shock applied to the device case 1 from the outside securely and favorably by the plurality of second buffer members 26 and to prevent the shock from being transmitted to the inner case 8.

Also, according to the portable terminal, the device case 1 has the upper case 2 and the lower case 3 and the plurality of support boss parts 25 is provided at least at the four corners in the inside of the upper case 2, so that it is possible to fix the four corners of the upper case 2 and the lower case 3 by the plurality of support boss parts 25 and the plurality of second buffer members 26. Thereby, it is possible to securely and favorably fix the upper case 2 and the lower case 3 and to securely and favorably buffer the shock from the outside by the second buffer members 26.

Also in this case, the device case 1 is provided with the support boss parts 25 and the second buffer members 26 at both sides of the intermediate part in the longitudinal direction in the inside of the device case 1, too, so that it is possible to fix both sides of the intermediate parts of the upper case 2 and the lower case 3 in the longitudinal direction by the plurality of support boss parts 25 and the plurality of second buffer members 26. For this reason, it is possible to further fix the upper case 2 and the lower case 3 securely and favorably and to securely and favorably buffer the shock from the outside by the plurality of second buffer members 26.

Also, in the device case 1, the plurality of screws 28, which are the fastening members, is fastened to the plurality of support boss parts 25 provided at the upper case 2 through the lower case 3. Therefore, since it is possible to screw and tighten the screws 28 to the support boss parts 25 of the upper case 2 through the lower case 3 from the outside of the lower case 3 with the upper case 2 and the lower case 3 being overlapped with each other, it is possible to simply and rigidly fix the upper case 2 and the lower case 3 each other.

In this case, the support boss part 25 is formed to have a cylindrical shape, the step-shaped protruding receiving portion 25a is formed at the outer periphery thereof, the lower case 3 is provided with the screw insertion hole portion 27 in which the screw 28 is to be inserted from the outside, and the second buffer member 26 is arranged between the receiving portion 25a of the support boss part 25 and the end portion of the screw insertion hole portion 27 of the lower case 3. Thereby, when the upper case 2 and the lower case 3 are tightened and fixed by the screws 28, it is possible to elastically sandwich the second buffer members 26 between the receiving portions 25a of the support boss parts 25 and the end portions of the screw insertion hole portions 27 of the lower case 3.

That is, in the device case 1, at the state where the upper case 2 and the lower case 3 are overlapped with each other, the screw 28 is inserted into the screw insertion hole portion 27 of the lower case 3 from the outside of the lower case 3, the screw portion 28b of the inserted screw 28 is inserted into the insertion hole of the contact portion 27b provided at the end portion of the screw insertion hole portion 27 and the screw portion 28b of the inserted screw 28 is screwed and tightened to the support boss part 25 of the upper case 2.

For this reason, in the device case 1, the head portion 28a of the screw 28 can press the contact portion 27b of the screw insertion hole portion 27 to the second buffer member 26 and press the second buffer member 26 to the receiving portion 25a of the support boss part 25. Therefore, it is possible to securely and favorably sandwich the second buffer member 26 between the receiving portion 25a of the support boss part 25 and the contact portion 27b of the screw insertion hole portion 27 of the lower case 3.

Thereby, in the device case 1, the second buffer member 26 is elastically sandwiched between the receiving portion 25a of the support boss part 25 and the contact portion 27b of the screw insertion hole portion 27 of the lower case 3, so that when the device case 1 is applied with the shock from the thickness direction, which is a front and back surface direction of the device case, it is possible to securely and favorably buffer the shock by the second buffer member 26.

Meanwhile, in the above embodiment, the support boss parts 25 and the second buffer members 26 are provided in the upper case 2. However, the present invention is not limited thereto. For example, the support boss parts 25 and the second buffer members 26 may be provided in the lower case 3 and the screw insertion hole portions 27 may be provided in the upper case 2.

Also, in the above embodiment, the device case 1 is used as the exterior member. However, the present invention is not limited thereto. For example, a member of which an inside is hollow, such as a housing may also be used.

Also, in the above embodiment, the inner case 8 is used as the inner member. However, the present invention is not limited thereto. For example, a member such as a frame member and a flat plate member may also be used.

Also, in the above embodiment, the present invention is applied to the portable terminal. However, it is not necessarily required to apply the present invention to the portable terminal. For example, the present invention can be applied to a portable device such as a mobile phone, a portable information processing device and the like.

Although the embodiment of the present invention has been described, the present invention is not limited thereto and is intended to include the inventions defined in the claims and the equivalent range.

(1) A portable device comprising:
an exterior member of which an inside is hollow:
a plurality of support parts provided in the inside of the exterior member so as to stand up in a direction perpendicular to a front or back surface of the exterior member;
a plurality of buffer members provided around each of the plurality of support parts, and
an inner member kept in the inside of the exterior member in parallel with the front or back surface of the exterior member without being in contact with the exterior member by the plurality of buffer members.

(2) The portable device according to (1), wherein
the plurality of support parts and the plurality of buffer members are provided at least at four corners in the inside of the exterior member.

(3) The portable device according to (1), wherein
the inner member has a plurality of mounting portions to be mounted to the plurality of buffer members, and
the plurality of mounting portions is mounted to outer peripheries of the plurality of buffer members.

(4) The portable device according to (1), wherein
each of the plurality of buffer members has an outer peripheral surface having a shape conforming to an inner peripheral surface perpendicular to the front or back surface of the exterior member and being in elastic contact with the inner peripheral surface of the exterior member.

(5) The portable device according to (4), wherein
each of the plurality of buffer members has a protrusion extending in a direction following an inner peripheral surface perpendicular to the front or back surface of the exterior member, and
the protrusion is in additionally elastic contact with the inner peripheral surface perpendicular to the front surface or back surface of the exterior member.

(6) The portable device according to (1), wherein
the exterior member comprises an upper case and a lower case, and
the plurality of support parts is provided at any one of the upper case and the lower case.

(7) The portable device according to (6), wherein
the plurality of support parts is provided at the upper case to stand up in a direction perpendicular to a front or back surface of the upper case, and
a plurality of fastening members is respectively fastened thereto through the lower case so that the upper case and the lower case are fixed to each other.

(8) The portable device according to (7), wherein
each of the plurality of support parts has a cylindrical shape and is formed at an outer periphery thereof with a protruding receiving portion,
the lower case is provided with a plurality of insertion hole portions in which the plurality of fastening members is to be inserted from an outside of the lower case, and
the plurality of buffer members is arranged between the receiving portions of the support parts and the insertion hole portions of the lower case.

(9) The portable device according to (1), wherein
the inner member is formed of a first synthetic resin.
(10) The portable device according to (9), wherein
the first synthetic resin is an ABS resin or a composite material of PC resin and ABS resin.
(11) The portable device according to (9), wherein
the buffer member is formed of a second synthetic resin having higher resiliency than the first synthetic resin.
(12) The portable device according to (11), wherein
the second synthetic resin is a silicon resin or elastomer.
(13) The portable device according to (1), wherein
the plurality of support parts and the plurality of buffer members are provided at four corners in the inside of the exterior member and both sides of an intermediate part in a longitudinal direction in the inside of the exterior member.
(14) A portable device comprising:
an exterior member of which an inside is hollow:
a plurality of support parts provided in the inside of the exterior member so as to stand up in a normal direction of a front or back surface of the exterior member:
a plurality of buffer members provided around each of the plurality of support parts, and
an inner member kept in the inside of the exterior member in parallel with the front or back surface of the exterior member without being in contact with the exterior member by the plurality of buffer members.

The invention claimed is:
1. A portable device comprising:
an exterior member comprising a front exterior surface, a back exterior surface and an inner surface configured to define a hollow interior;
a plurality of support parts provided in the hollow interior of the exterior member, wherein each of the plurality of support parts extends in a direction perpendicular to the front exterior surface or the back exterior surface of the exterior member;
an inner member provided in the hollow interior of the exterior member; and
a plurality of buffer members, wherein each of the plurality of buffer members is provided around a corresponding one of the plurality of support parts, wherein the plurality of buffer members are configured to buffer the inner member from being in contact with the exterior member,
wherein the each of the plurality of buffer members comprises:
a main part provided around the corresponding one of the plurality of support parts,
wherein the main part has a shape conforming to a corresponding portion of the inner surface of the exterior member perpendicular to the front exterior surface or the back exterior surface of the exterior member, and
wherein the main part is in elastic contact with the corresponding portion of the inner surface of the exterior member; and
a protrusion extending from the main part in a direction following another corresponding portion of the inner surface of the exterior member perpendicular to the front exterior surface or the back exterior surface of the exterior member, and
wherein the protrusion is in additionally elastic contact with the another corresponding portion of the inner surface of the exterior member.
2. The portable device according to claim 1,
wherein the plurality of support parts and the plurality of buffer members are provided at least at four corners formed by the inner surface of the exterior member.
3. The portable device according to claim 1,
wherein the inner member is mounted to outer peripheries of the plurality of buffer members.
4. The portable device according to claim 1,
wherein the exterior member comprises an upper case and a lower case, and
wherein the plurality of support parts is provided at any one of the upper case and the lower case.
5. The portable device according to claim 4,
wherein the plurality of support parts is provided at the upper case of the exterior member, and
wherein the portable device further comprises a plurality of fastening members, wherein each of the plurality of fastening members is respectively fastened through the lower case of the exterior member to the upper case of the exterior member to fix the upper case of the exterior member to the lower case of the exterior member.
6. The portable device according to claim 5,
wherein the each of the plurality of support parts comprises a protruding receiving portion formed at the outer periphery of the each of the plurality of support parts,
wherein the lower case is provided with a plurality of insertion hole portions in which the plurality of fastening members is inserted from an outside of the lower case, and
wherein the each of the plurality of buffer members is arranged between a corresponding one of the protruding receiving portions of the support parts and a corresponding one of the insertion hole portions of the lower case.
7. The portable device according to claim 1, wherein
the inner member is formed of a first synthetic resin.
8. The portable device according to claim 7,
wherein the first synthetic resin is an acrylonitrile butadiene styrene (ABS) resin or a composite material of a polycarbonate (PC) resin and the ABS resin.
9. The portable device according to claim 7,
wherein the each of the plurality of buffer members is formed of a second synthetic resin having higher resiliency than the first synthetic resin.
10. The portable device according to claim 9, wherein
the second synthetic resin is a silicon resin or elastomer.
11. The portable device according to claim 1,
wherein the plurality of support parts and the plurality of buffer members are provided at a first corner and a second corner formed by the inner surface at a first position in a longitudinal direction of the exterior member, a third corner and a fourth corner formed by the inner surface at a second position in the longitudinal direction of the exterior member, and two intermediate part formed by the inner surface at an intermediate position between the first position and the second position in the longitudinal direction.

* * * * *